United States Patent
Korden et al.

(10) Patent No.: US 7,057,478 B2
(45) Date of Patent: Jun. 6, 2006

(54) COMPONENT FUNCTIONING WITH BULK ACOUSTIC WAVES HAVING COUPLED RESONATORS

(75) Inventors: Christian Korden, Deutschlandsberg (AT); Werner Ruile, München (DE)

(73) Assignee: Epcos AG, Munich (DE)

( * ) Notice: Subject to any disclaimer, the term of this patent is extended or adjusted under 35 U.S.C. 154(b) by 88 days.

(21) Appl. No.: 10/837,211

(22) Filed: Apr. 30, 2004

(65) Prior Publication Data

US 2005/0012570 A1 Jan. 20, 2005

(30) Foreign Application Priority Data

Apr. 30, 2003 (DE) ................. 103 19 554

(51) Int. Cl.
*H03H 9/54* (2006.01)
(52) U.S. Cl. .............. 333/189; 333/190; 333/191
(58) Field of Classification Search ........... 333/187, 333/189
See application file for complete search history.

(56) References Cited

U.S. PATENT DOCUMENTS

| | | | | |
|---|---|---|---|---|
| 1,959,429 A | * | 5/1934 | Hovgaard | 333/189 |
| 3,422,371 A | * | 1/1969 | Poirier et al. | 331/107 A |
| 3,582,836 A | * | 6/1971 | Kent | 333/191 |
| 3,582,839 A | * | 6/1971 | Pim et al. | 333/191 |
| 3,699,484 A | * | 10/1972 | Berlincourt | 333/191 |
| 4,320,365 A | * | 3/1982 | Black et al. | 333/187 |
| 4,329,666 A | * | 5/1982 | Arvanitis | 333/191 |
| 5,233,259 A | * | 8/1993 | Krishnaswamy et al. | 310/324 |
| 5,692,279 A | * | 12/1997 | Mang et al. | 29/25.35 |
| 5,821,833 A | | 10/1998 | Lakin | 333/187 |
| 5,864,261 A | * | 1/1999 | Weber | 333/187 |
| 5,910,756 A | * | 6/1999 | Ella | 333/133 |
| 6,150,703 A | | 11/2000 | Cushman et al. | 257/415 |
| 6,215,375 B1 | | 4/2001 | Larson, III et al. | 333/187 |
| 6,278,342 B1 | | 8/2001 | Ellä | 333/189 |
| 6,323,744 B1 | | 11/2001 | Barber et al. | 333/189 |
| 6,344,705 B1 | | 2/2002 | Solal et al. | 310/313 B |
| 6,448,695 B1 | | 9/2002 | Milsom | 310/334 |
| 6,720,844 B1 | * | 4/2004 | Lakin | 333/189 |
| 6,917,261 B1 | * | 7/2005 | Unterberger | 333/189 |

(Continued)

FOREIGN PATENT DOCUMENTS

DE 102 13 277 10/2003

(Continued)

OTHER PUBLICATIONS

Scholl et al, "New Resonator Filter With High Sidelobe Suppression", *IEEE Ultrasonics Symposium 1992*, pp. 117-121.

(Continued)

*Primary Examiner*—Barbara Summons
(74) *Attorney, Agent, or Firm*—Schiff Hardin LLP

(57) ABSTRACT

A component that functions with bulk acoustic waves, particularly a bandpass filter, has an increased number of degrees of design freedom in order to improve the transmission characteristics of the component. The component has BAW resonators coupled acoustically in the vertical and/or lateral direction through common electrodes, coupling layer systems and through the excitation of lateral acoustic modes. Through the acoustic coupling of the resonators, it is possible to create additional pole points in the transfer function so that in this manner, the rejection band characteristics of a bandpass filter can be improved. Through acoustic paths which are added in addition to the electrical connection, the insertion loss can be reduced. Through an acoustic coupling instead of an electrical connection, decoupling between input and output loops of a circuit can be achieved.

25 Claims, 15 Drawing Sheets

U.S. PATENT DOCUMENTS

| | | | |
|---|---|---|---|
| 6,919,781 B1 * | 7/2005 | Baier et al. | 333/195 |
| 6,946,928 B1 * | 9/2005 | Larson et al. | 333/189 |
| 2004/0124952 A1 * | 7/2004 | Tikka | 333/189 |

FOREIGN PATENT DOCUMENTS

| | | | |
|---|---|---|---|
| EP | 0 718 970 | | 6/1996 |
| JP | 2002-217676 | * | 8/2002 |
| WO | WO 01/06646 | | 1/2001 |
| WO | WO 01/99276 | | 12/2001 |
| WO | WO 2004/034579 | * | 4/2004 |

OTHER PUBLICATIONS

Martin et al, "A SAW Resonator Filter Using Longitudinal and Transverse Modes", *IEEE Ultrasonics Symposium, 1996* pp. 53-56.

K.M. Lakin, "Thin Film Resonators and High Frequency Filters", *TFR-Technologies General Technical Reference* 01, Jun. 2001, pp. 1-18.

Lakin et al, "High Performance Stacked Crystal Filters for GPS and Wide Bandwidth Applications", *IEEE 2001 Ultrasonics Symposium Paper 3E-6*, Oct. 9, 2001, pp. 1-6.

* cited by examiner

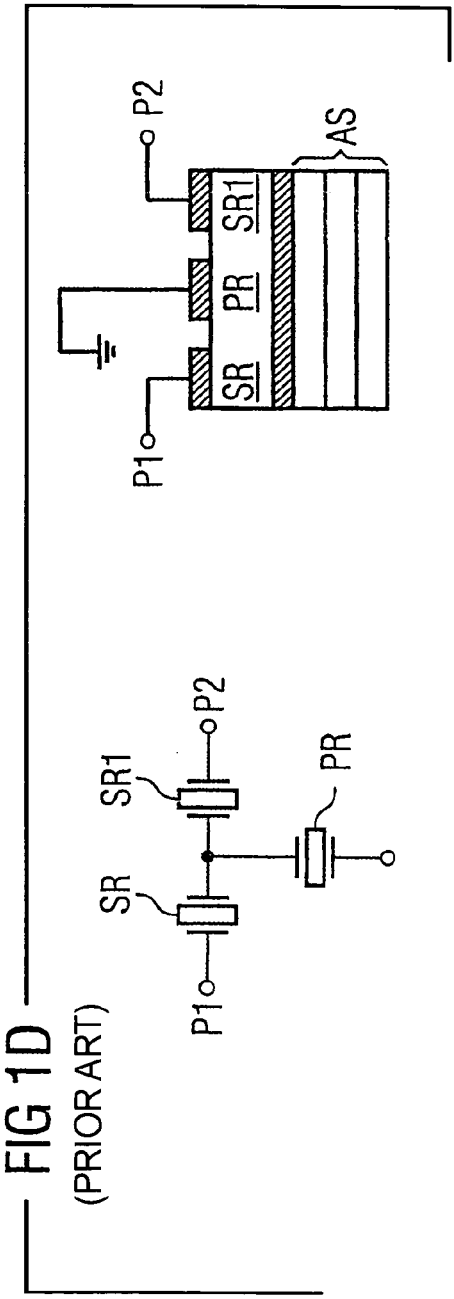
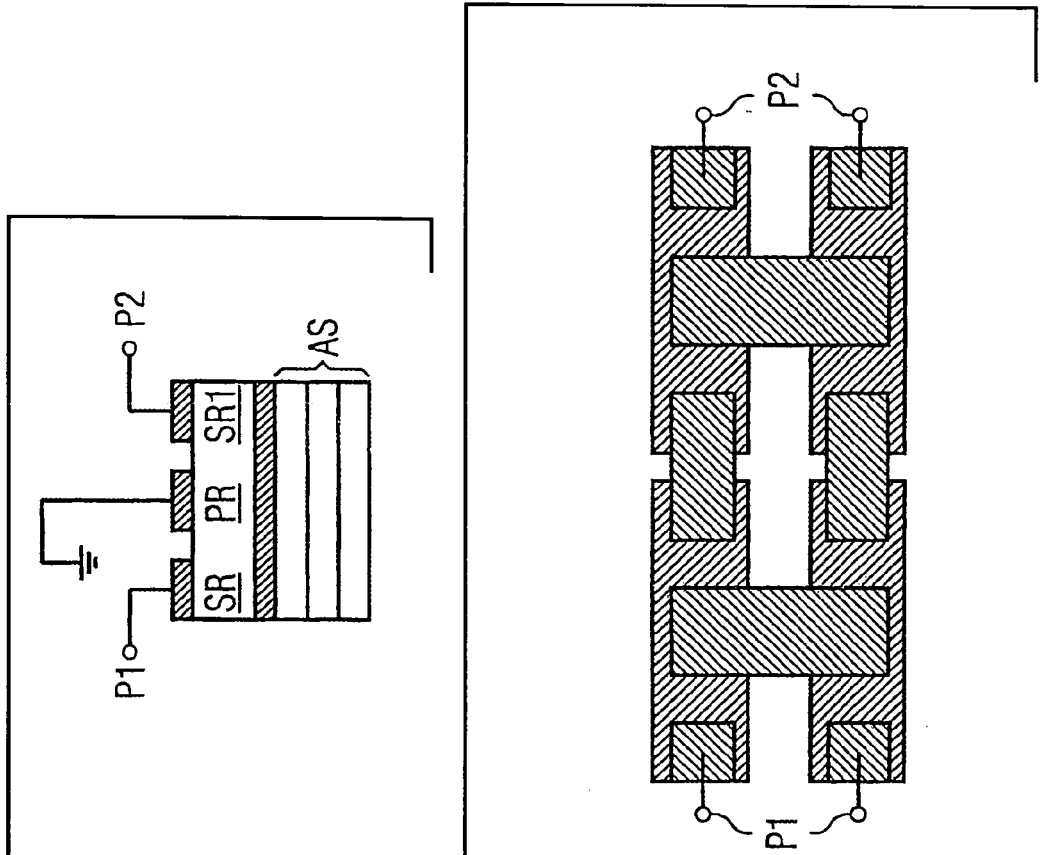
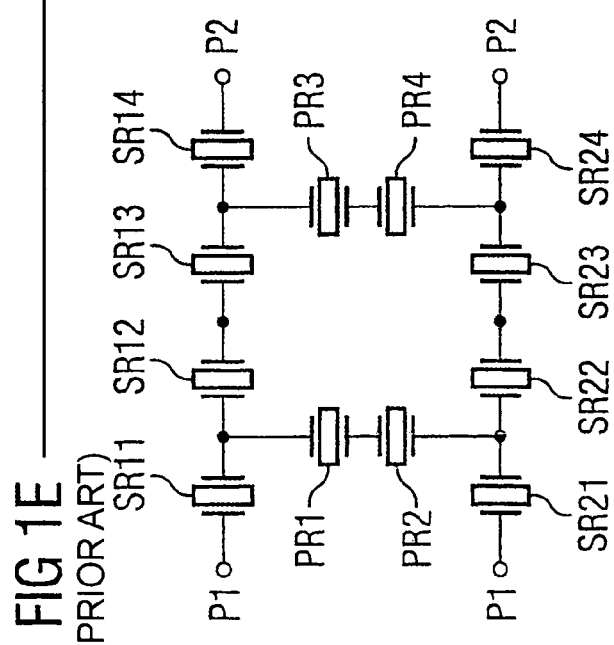
FIG 1D (PRIOR ART)
FIG 1E (PRIOR ART)

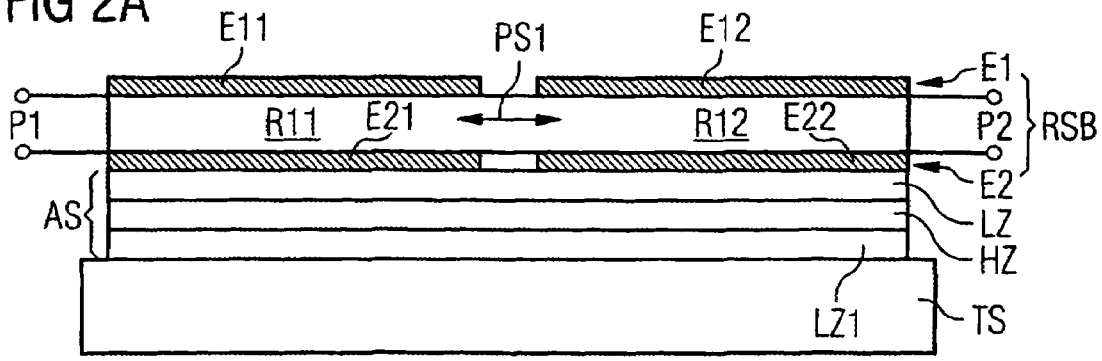
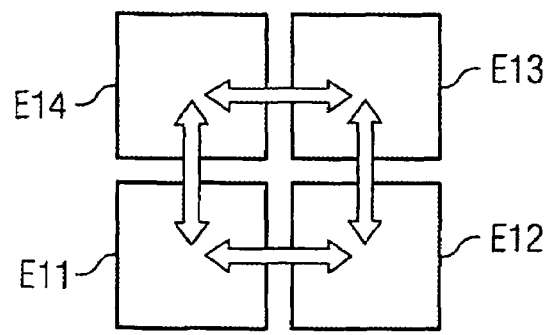
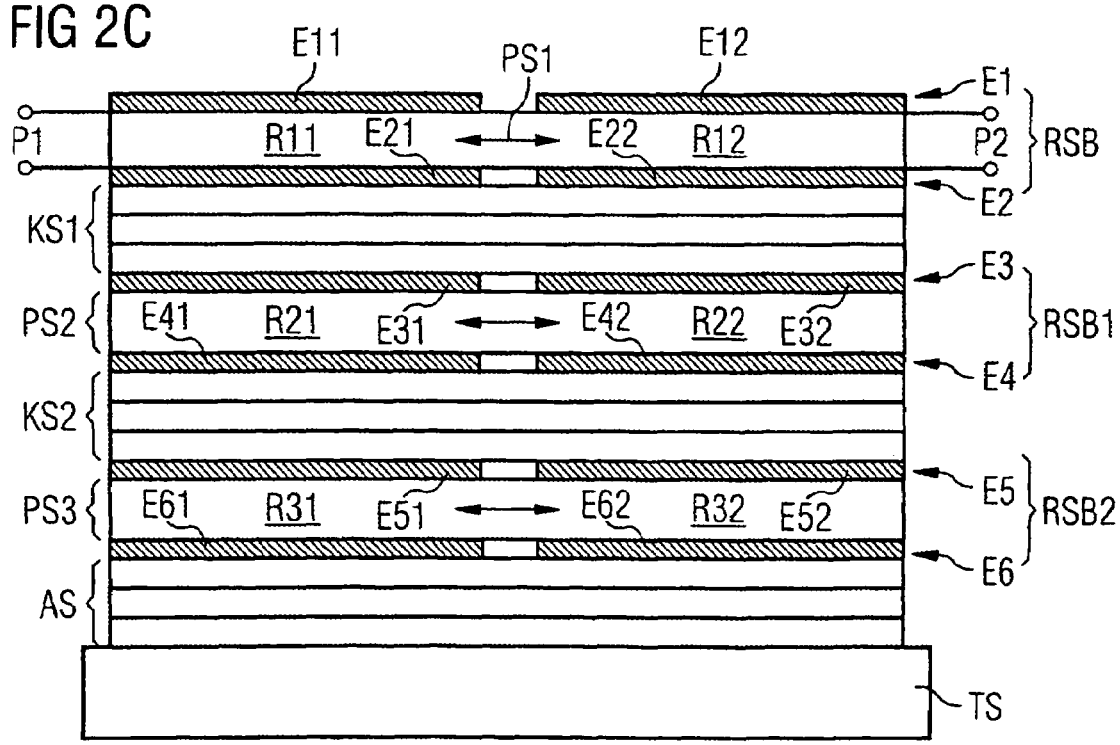

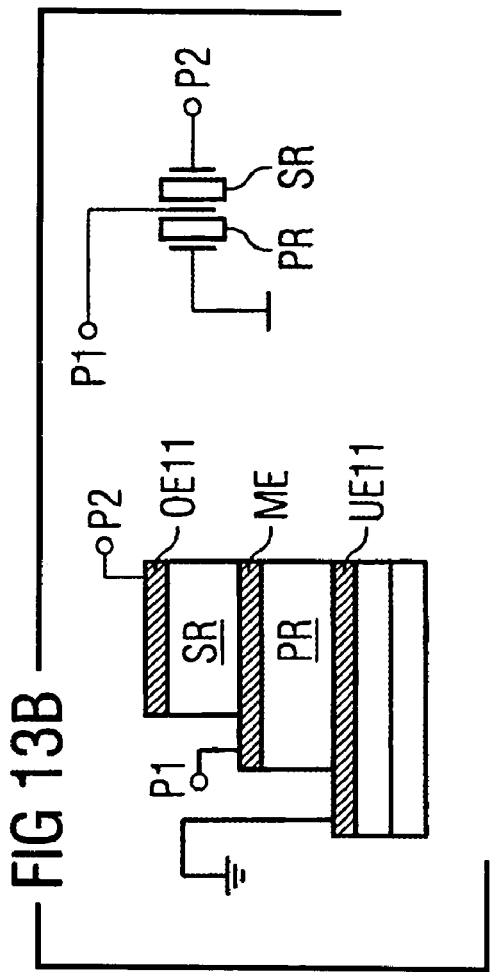
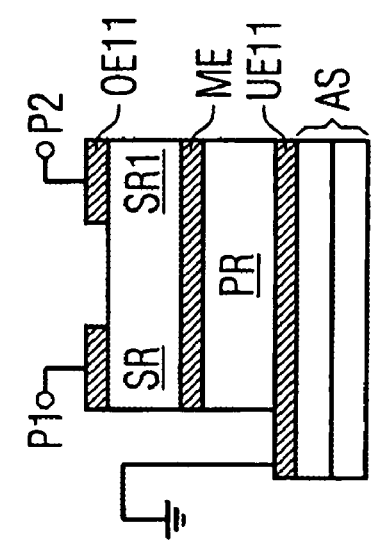
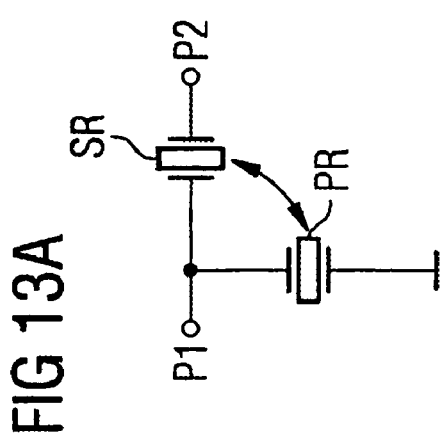
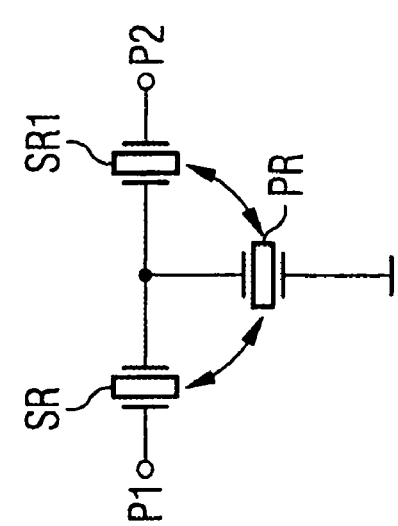
FIG 13B
FIG 14B
FIG 13A
FIG 14A

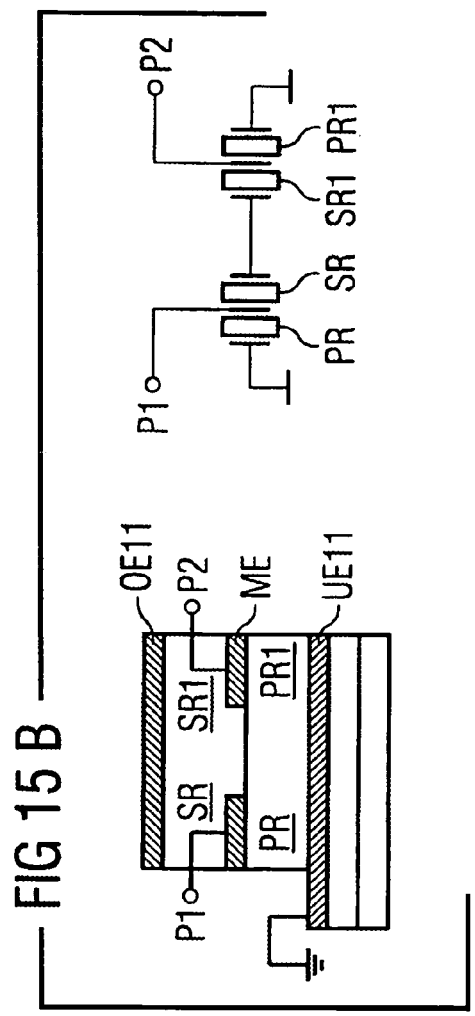
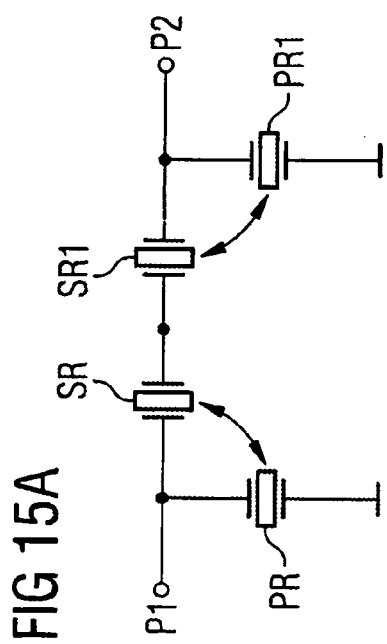

COMPONENT FUNCTIONING WITH BULK ACOUSTIC WAVES HAVING COUPLED RESONATORS

BACKGROUND OF THE INVENTION

The present invention is concerned with a component that functions with bulk acoustic waves, particularly a bandpass filter.

One filter technology that functions with acoustic waves is known as a thin film bulk acoustic wave resonator or FBAR, and another is a bulk acoustic wave filter, which is known as a BAW filter. Both of these filters can be implemented as bandpass filters by interconnecting different thin-film resonators (FBAR) built using FBAR technology.

BAW components have a multi-layer structure having a plurality of layers arranged one over the other. Here, it is possible to have a vertical structure consisting of a plurality of BAW resonators as is known and disclosed in U.S. Pat. No. 5,821,833, whose disclosure is incorporated herein by reference thereto.

FIG. 1A shows an exemplary BAW component having a resonator stack which includes a plurality of resonators arranged over one another.

A resonator that functions with bulk acoustic waves, for example a resonator R3A in FIG. 1A has a piezoelectric layer PS3, which is arranged between two electrode layers E5 and E6. It is known that instead of only one piezoelectric layer, a layer sequence can also be used. The layers are deposited on a substrate TS one after another and structured into the resonators. As illustrated, the stack includes electrode layers E1 and E2, which are on opposite sides of a piezoelectric layer PS1, and electrode layers E3 and E4, which are on opposite sides of a piezoelectric layer PS2. The electrode layers, such as E1, E2, E3 and E4, are structured in the lateral plane so that sub-electrodes E11 and E12 are formed from the layer E1; sub-electrodes E21 and E22 are formed from the layer E2 and sub-electrodes E31, E32, E41 and E42 are formed from the remaining two electrode layers. The sub-electrodes E11 and E21 lying over one another form together with the piezoelectric layer PS1 lying therebetween a sub-resonator R11. Sub-resonators R12, R21 and R22 are built in a similar manner. Between the electrode layers E2 and E3 and layers E4 and E5 are coupling layer systems KS1 and KS2, respectively, which systems are acoustically at least partially transmissive. These coupling layer systems along with sub-resonators, such as R21 and R22 arranged therebetween, guarantee an acoustic coupling in the vertical direction between the subresonators R11 and R12 in the vertical direction with the resonator R3A and the transmission of an electrical signal is possible from the sub-resonator R11 to the sub-resonator R12 in case of the galvanic isolation therebetween.

The sub-resonator R11 is connected to a first electrical gate P1 used to couple in an electrical signal. The sub-resonator R12 is connected to a second electrical gate P2 to couple out the electrical signal.

The electrical series connection of the acoustically coupled sub-resonators R11/R21 and R12/R22 of the two resonator stacks formed adjacent one another takes place by means of the continuously formed electrode layer E5.

The multi-layer structure shown in FIG. 1A in schematic cross-section is arranged on the substrate TS. It is known that a resonator stack can be arranged over a hollow space provided in the carrier substrate or over an acoustic mirror, such as AS.

It is known that the resonators and/or sub-resonators arranged over one another or adjacent to one another can be electrically connected to one another and, together, can provide a filter element or a filter circuit, particularly a bandpass filter. A bandpass filter of this sort can be used together with additional filters also in a duplexer.

In FIG. 1B, an exemplary known implementation of the electrical and acoustic connection via a middle electrode layer ME of two series resonators SR1 and SR2 arranged over one another is schematically illustrated in the left side of the Figure and are shown in a circuit diagram on the right side of the Figure.

In FIG. 1C, a circuit diagram on the left side of the Figure for a basic element of a ladder type filter with a series resonator SR arranged in a signal line and a parallel resonator PR parallel to a signal line is shown. On the right side of the Figure, the schematic design of such a basic element is shown in cross-section. The series resonator SR is arranged laterally adjacent to the parallel resonator PR.

In FIG. 1D, a T-element can be formed with: series resonators SR and SR1 arranged adjacent to one another and a parallel resonator PR. These are shown in a circuit diagram on the left side of the Figure and shown in cross-section on the right side of the Figure. Also known is a filter structure shown in FIG. 1E on the left side, which consists of a plurality of interconnected T-elements. This filter structure is suited particularly to transmission of symmetrical or balanced electrical signals. The series resonators SR11, SR12, SR13 and SR14 are arranged in a first signal line. The series resonators SR21, SR22, SR23 and SR24 are arranged in a second signal line. The two signal lines are connected to one another using parallel branches which include at least two parallel resonators PR1, PR2 and PR3, PR4. The resonators are arranged adjacent to one another and are illustrated in the left side of the Figure as a circuit diagram and have a schematic top view of the filter structure shown in the right side of FIG. 1E.

Series and/or parallel resonators can be connected, in each case, to an inductance, for example a bond wire, in series in order to increase the passband width. It is also possible in case of interconnection of a plurality of series resonators with a plurality of parallel branches to bridge some of the series resonators between the adjacent parallel branches or to omit parallel branches between two series resonators. Some of the resistors can be replaced, for example, with a capacitance, an inductance or an LC element. For subsequent adaptation of the static capacitance of a BAW resonator, for example improving the rejection band selectivity, a capacitor can be connected in parallel to it.

In a BAW resonator, preferably only one acoustic mode, which is a main mode, is excited which, however, is often coupled to additional, undesired, particularly lateral, acoustic modes. Due to this mode coupling, the emergence of the acoustic energy out of an active resonator region occurs, which leads to energy losses and, thus, to a high insertion loss in the signal to be transmitted. The localization of the acoustic wave in the active resonator region occurs, for example, through the attenuation of the excitation in the edge region of the BAW resonator. This can be attained through addition of an additional material frame in the edge region of the upper electrode of the resonator or also through a special electrode configuration with sides that do not run parallel to one another, as shown, for example, from the International Publication WO 01/06646, whose disclosure is incorporated herein by reference thereto.

In addition, it is known from International Publication WO 01/99276 A1 and U.S. Pat. No. 6,448,695 B2, which claims priority from the same British Application and whose disclosure is incorporated herein by reference thereto, that resonators that are arranged laterally adjacent to one another and electrically connected through a common electrode can be acoustically coupled additionally through a lateral acoustic mode. This additional acoustic signal path contributes, in this case, to a particularly efficient signal transmission between two resonators, and it is possible to attain a particularly low insertion loss in the signal.

Almost all of the previously known BAW resonators, particularly with ladder-type filter topologies, have in common that they do not satisfactorily fulfill the demanding requirements of mobile radio operators for rejection band selectivity. A problem which is not uncommon and which is difficult to solve in a BAW filter design is that of attaining a low insertion loss.

SUMMARY OF THE INVENTION

An object of the present invention is to specify a component that functions with acoustic waves which offers improved transmission characteristics.

One embodiment of the invention is a component that functions with bulk acoustic waves with a multi-layer structure, for example a resonator stack, which has a first electrode layer arranged above and a second electrode layer arranged below a piezoelectric layer arranged therebetween which together form a resonator layer region. It is also possible to arrange additional resonator layer regions formed in this manner in a resonator stack over one another. Here, all of the electrode layers are structured in the lateral plane so that there results per electrode layer at least two electrically isolated sub-electrodes. In each case, two sub-electrodes arranged over one another form together with the piezoelectric layer lying therebetween a sub-resonator. A number of the sub-resonators arranged laterally adjacent to one another corresponds to the number of sub-resonators resulting in a respective resonator layer region. According to the invention, at least two of the sub-resonators arranged in the resonator layer region are coupled acoustically by a lateral acoustic mode.

An embodiment of the invention is based on the effect of coupling different modes that can be excited in a BAW resonator of bulk acoustic waves, particularly the coupling between the main mode and the lateral mode, which effect had to be suppressed in most BAW applications known heretofore. The lateral acoustic coupling is used according to the invention for the first time instead of an electrical connection, while the acoustic coupling and the component known, for example, from International Publication WO 01/99276 and U.S. Pat. No. 6,448,695 B2, represent an additional signal path running in parallel to the electrical signal.

The component according to the invention fulfills preferably the function of a filter, particularly a bandpass filter. In an advantageous variant of the invention, one of the resonator layer regions is divided into two sub-resonators of which one sub-resonator is connected with respect to a first reference potential and the other sub-resonator with respect to the second reference potential, the two reference potentials differing from one another. In an advantageous manner, a component according to the invention fulfills, in such an embodiment, in addition to the function of a bandpass filter, the function of an "acoustic transformer" for decoupling input and output signals.

It is also possible that one of the acoustically laterally coupled sub-resonators is connected with respect to the first reference potential and the other sub-resonator between two signal lines. In this configuration, a component according to the invention makes it possible to build a balanced to an unbalanced functionality or a balun functionality that requires little space.

The acoustically coupled sub-resonators of a resonator layer region can also be connected, in each case, between two signal lines of the component fed from a symmetrically formed first electrical gate to a likewise symmetrically formed second electrical gate. Here, it is possible that the sub-resonators that are acoustically coupled in the lateral direction are arranged in two different signal paths or parallel to different signal paths. Another possibility consists in that one of the acoustically coupled sub-resonators is arranged in one signal path and the other sub-resonator parallel to another signal path. Different signal paths can be formed, for example, as a transmit and a corresponding receive path of a mobile radio system whose filters are realized on the component according to this invention.

Another advantage of a component according to the present invention consists in that through the acoustic coupling of the resonators, additional pole points arise in the transfer function of the component, which contribute in case of a suitable design to the improvement of the signal suppression in the rejection band.

In case of purely acoustic coupling of the resonators within a filter circuit, filter transfer functions can be obtained with a steep edge slope, high rejection band suppression, low insertion loss and low ripple in the passband. Moreover, using acoustic coupling of the resonators, the connecting technology that is needed otherwise for electrical connection can be spared. A component according to the invention can be operated in a balanced/balanced manner, an unbalanced/unbalanced manner or as a balun and can act, moreover, in an impedance transforming manner.

The invention is compared hereafter with components known from the prior art and explained in greater detail using schematic figures which are not true to scale.

Other advantages and features of the invention will be readily apparent from the following description, the claims and drawings.

BRIEF DESCRIPTION OF THE DRAWINGS

FIG. 1D, on the left side, is a circuit diagram of a known BAW component with resonators arranged adjacent to one another of a T-element and, on the right side, has a schematic cross-sectional view of the component;

FIG. 1E, on the left side, is a circuit diagram of another known BAW component for transmitting a balanced signal, with resonators arranged adjacent to one another and is a schematic top view of the component shown on the right side of the Figure;

FIG. 2A is a schematic cross-sectional view of a BAW component with resonators arranged adjacent to one another, electrically isolated from one another and coupled acoustically through a lateral acoustic mode in accordance with the present invention;

FIG. 2B is a schematic plan view of a BAW component according to FIG. 2A;

FIG. 2C is a schematic cross-sectional view of a BAW component with a plurality of resonator layers with sub-resonators in each resonator layer region arranged adjacent to one another and being electrically isolated from one another and coupled acoustically through a lateral acoustic mode;

FIG. 13A is a circuit diagram of a basic element of a BAW component with a ladder-type structure with acoustic coupling between a series and a parallel resonator;

FIG. 13B is a BAW component with series resonators and parallel resonators arranged over one another and with acoustic coupling between the series and the parallel resonators, which is shown in a schematic cross-sectional view on the left side of the Figure and in a Circuit diagram on the right side of the Figure;

FIG. 14A is a circuit diagram of a T-element of a BAW component with acoustic coupling between a parallel resonator and a series resonator;

FIG. 14B is a schematic cross-sectional view of a BAW component with a resonator stack with acoustic coupling between series resonators and a parallel resonator;

FIG. 15A is a circuit diagram of a π element of a BAW component with acoustic coupling between series and parallel resonators;

FIG. 15B is a BAW component with a resonator stack with acoustic coupling between series and parallel resonators which is shown in schematic cross-section on the left side of the Figure and in a circuit diagram on the right side of the Figure;

DESCRIPTION OF THE PREFERRED EMBODIMENTS

Figure 1A:
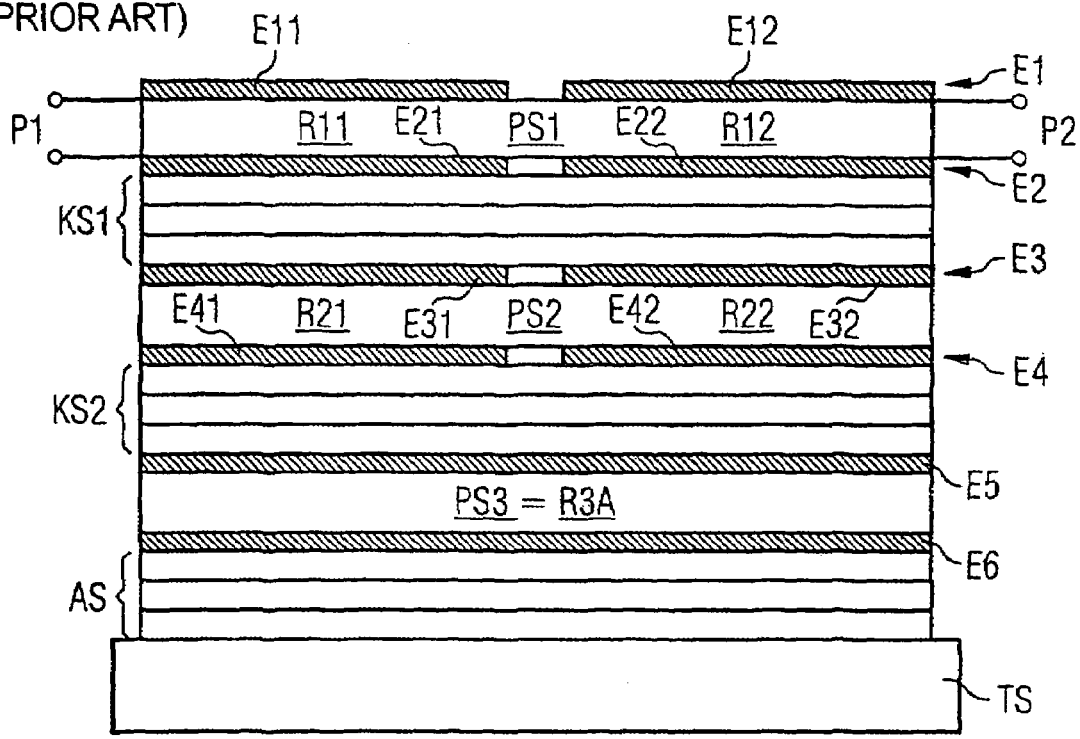
FIG. 1A is a schematic cross-sectional view of a known BAW component with resonators arranged over one another.
Figure 1B:
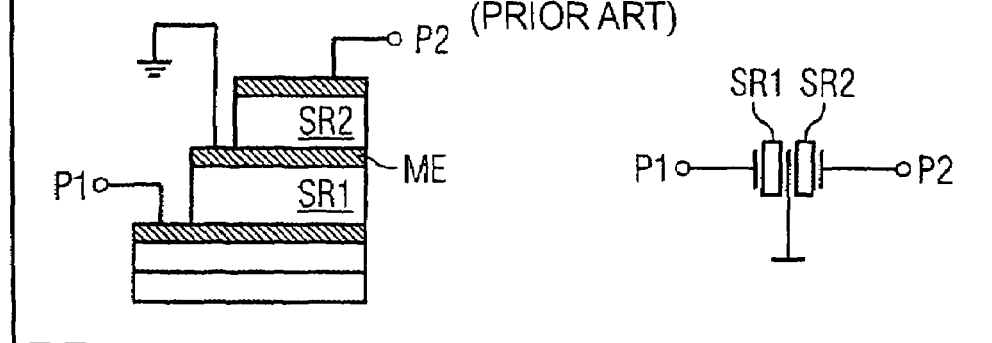
FIG. 1B, on the left side, has a schematic cross-sectional view of a known BAW component with series resonators arranged over one another and, on the right side, has a circuit diagram of the component.
Figure 1C:
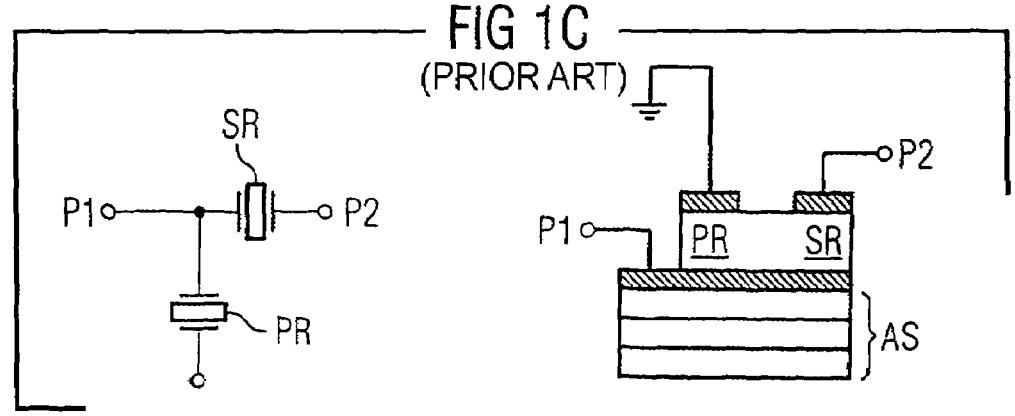
FIG. 1C, on the left side, has a circuit diagram of a known BAW component with resonators arranged adjacent to one another of a filter basic element and is shown in a schematic cross-sectional view in the right side of the Figure.

Elements that are identical or have identical functions are provided in each case with identical reference numbers in all Figures.

The principles of the present invention are particularly useful when incorporated in a component shown in cross-section in FIG. 2A. The component has a resonator layer region RSB with a first electrode layer E1, a second electrode layer E2 and a piezoelectric layer PS1 arranged therebetween. The resonator layer region RSB is arranged on a carrier substrate TS. Between the resonator layer region RSB and the carrier substrate TS, an acoustic mirror AS is provided, whose structure represents an alternating sequence of layers with a layer HZ of a high acoustic impedance and layers LZ and LZ1 with a low acoustic impedance. Such a mirror is known per se. The electrode layer E1 is structured in a lateral plane to form sub-electrodes E11 and E12. In a similar way, the electrode layer E2 is structured in the lateral plane to form sub-electrodes E21 and E22. The sub-electrodes E11 and E21 are arranged over one another and form together with the piezoelectric layer PS1 lying therebetween a sub-resonator R11, which is connected to the first electrical gate P1. The sub-electrodes E12 and E22 arranged over one another form together with the piezoelectric layer lying therebetween a sub-resonator R12. which is connected to a second electrical gate P2. The acoustic coupling of the sub-resonators R11 and R12 in the lateral direction is represented schematically by an arrow.

The lateral coupled sub-resonators or rather their sub-electrodes are spaced apart, preferably by 0.5 µm to 2 µm, in order to obtain an optimum lateral coupling.

FIG. 2B shows a component according to the invention with four sub-electrodes E11, E12, E13 and E14 for each electrode layer. It is possibly advantageous for setting a desired impedance if these sub-electrodes are formed differently. Arrows designate the lateral acoustic coupling of the corresponding sub-resonators that lie below each of the sub-electrodes E11, E12, E13 and E14.

FIG. 2C shows a different embodiment of the invention in schematic cross-section. In the multi-layer structure of a BAW component, more than just one resonator layer region is provided and, as illustrated, the component has resonator layer regions RSB, RSB1 and RSB2, which are arranged one over the other.

The resonator layer region RSB is structured as shown in FIG. 2A. The resonator layer region RSB1 includes electrode layers E3 and E4 and a second piezoelectric layer PS2 arranged therebetween. The resonator layer region RSB2 includes a piezoelectric layer PS3 arranged between electrode layers E5 and E6. The electrode layers E3, E4, E5 and E6 are structured in the lateral plane to form sub-electrodes E31, E32, E41, E42, E51, E52, E61 and E62.

An acoustically at least partially transmissive coupling layer system KS1 is arranged between electrode layers E2 of the resonator layer region RSB and E3 of the resonator layer region RSB1. In a similar way, a second coupling system KS2 is arranged between electrode layer E4 of the resonator layer region RSB1 and E5 of the resonator layer region RSB2.

The coupling layer systems KS1 and KS2 are used to transfer acoustic energy and can consist in each case of one layer, for example silicon oxide, or a plurality of layers, for example a layer sequence made up of $SiO_2$ and AlN. Through the coupling layer KS1, sub-resonators R11 and R21 arranged over one another as well as R12 and R22 are at least partially acoustically coupled. In a similar manner, the coupling layer system KS2 acoustically couples in a vertical direction the sub-resonators R21 to R31 and R22 to R32.

The coupling layer system includes acoustically partially transmissive layers which have, in each case, preferably a thickness of an uneven number of quarter wavelengths and an alternating sequence of layers with high and low acoustic impedance. The coupling degree of a coupling layer system can be set using the material characteristics, thickness and number of intermediate layers. The bandwidth of a coupling layer system and an acoustic mirror are set so that the undesired couplings or acoustic modes at frequencies below and above the passband, preferably below half the operating frequency and above twice the operating frequency, are suppressed.

In the embodiment of the invention, unlike, for example, the variant of the invention shown in FIG. 2A, there also exists, in addition to the lateral acoustic coupling of the directly adjacent sub-resonators of the resonator layer region, a vertical acoustic coupling of the sub-resonators arranged over one another within a resonator stack. Here, the sub-resonators of a resonator stack are electrically isolated from the sub-resonators of the other resonator stack. The excitation of the resonators takes place by applying an electrical signal to the sub-resonator R11 (here arranged above) of the first resonator stack. The output signal is taken preferably at a sub-resonator R12 of the second resonator stack that is coupled acoustically laterally with this sub-resonator.

It is provided according to the invention that sub-resonators arranged directly over one another have a common middle sub-electrode. Here, a particularly efficient acoustic coupling is obtained in the vertical direction.

Figure 3B:
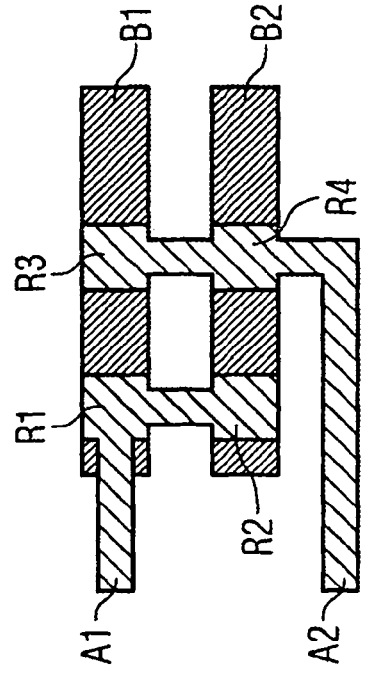
FIG. 3B is a schematic top plan view of the BAW component according to FIG. 3A.
Figure 3A:
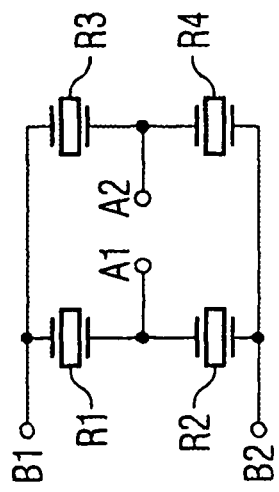
FIG. 3A is a circuit diagram of a known BAW component with a bridge connection of the resonators.

In FIG. 3A, a circuit diagram shows a bridge connection, known per se, of a BAW resonator which has sub-resonators R1, R2, R3 and R4. The sub-resonator R1 is connected between the electrical terminals A1 and B1. The sub-resonator R2 is connected between the electrical terminals A1 and B2. The sub-resonator R3 is connected between the electrical terminals A2 and B1. The sub-resonator R4 is connected between the electrical terminals A2 and B2.

FIG. 3B shows an implementation corresponding to the circuit diagram of FIG. 3A, which is known from U.S. Pat. No. 6,278,342 B1 of a resonator bridge connection with sub-resonators R1, R2, R3 and R4 arranged adjacent to one another in a schematic top view. The shaded areas are the metallizations and the electrodes formed from them. The piezoelectric layers are arranged between these shaded areas.

Figure 4B:
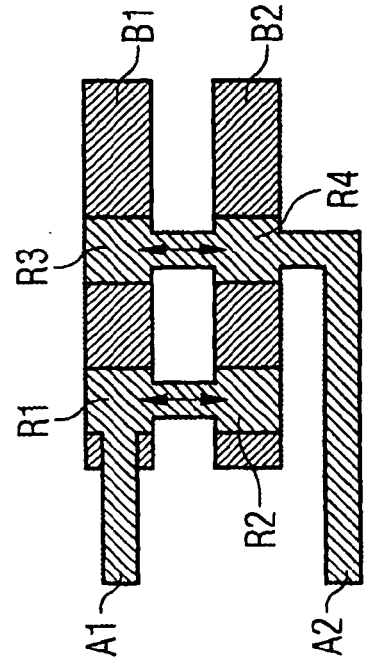
FIG. 4B is a schematic top view of the BAW component of FIG. 4A.
Figure 4A:
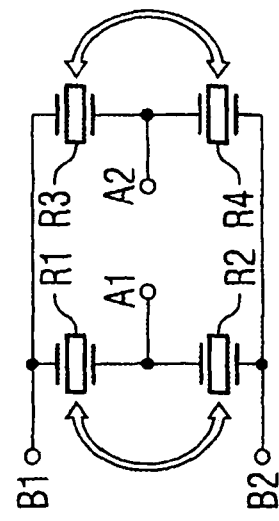
FIG. 4A is a circuit diagram of a BAW component with a bridge connection of the acoustically coupled resonators.
Figure 5A:
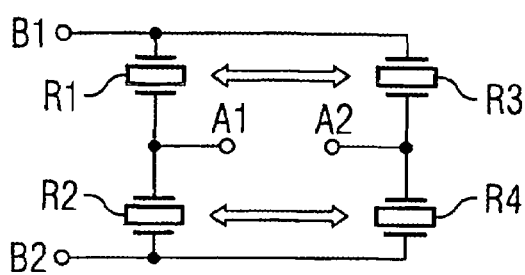
FIG. 5A is a circuit diagram of a BAW component with a bridge connection of the acoustically coupled resonators.
Figure 5B:
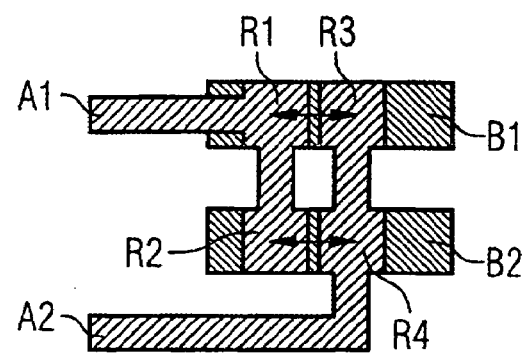
FIG. 5B is a schematic top view of the BAW component of FIG. 5A.

FIGS. 4A and 5A show, in each case, circuit diagrams of an advantageous additional development of the invention with bridge connections of sub-resonators R1, R2, R3 and R4. In FIG. 5A, pairs of sub-resonators R2 and R4 or R1 and R3 have, in each case, a lateral acoustic coupling between each other. In FIGS. 4B and 5B, in each case, an exemplary implementation of bridge connections corresponding to FIGS. 4A and 5A of sub-resonators is shown in a schematic top view.

FIGS. 4A and 5A show, in each case, a BAW component containing a resonator layer region which includes, as in FIG. 2A, a first electrode layer E1 arranged above and a second electrode layer E2 arranged below and a piezoelectric layer PS1 arranged therebetween, the electrode layers being structured in the lateral plane so that each electrode layer is sub-divided in at least four sub-electrodes like the sub-electrodes E11, E12, E13 and E14 shown in FIG. 2B. In each case, two sub-electrodes arranged over one another form together with the piezoelectric layer PS1 lying therebetween a sub-resonator R11, R12 in FIG. 2A corresponding to the sub-resonators R1, R2, R3, R4 in FIGS. 4A and 5A. The sub-resonators R1, R2, R3, R4 are formed in this manner are interconnected in a bridge connection. At least two of the sub-resonators R1, R2, R3, R4 arranged laterally adjacent to one another are coupled acoustically through lateral acoustic mode. The acoustic coupling between the corresponding sub-resonators is shown schematically in FIGS. 4A, 5A, 4B and 5B using arrows.

Figure 6:
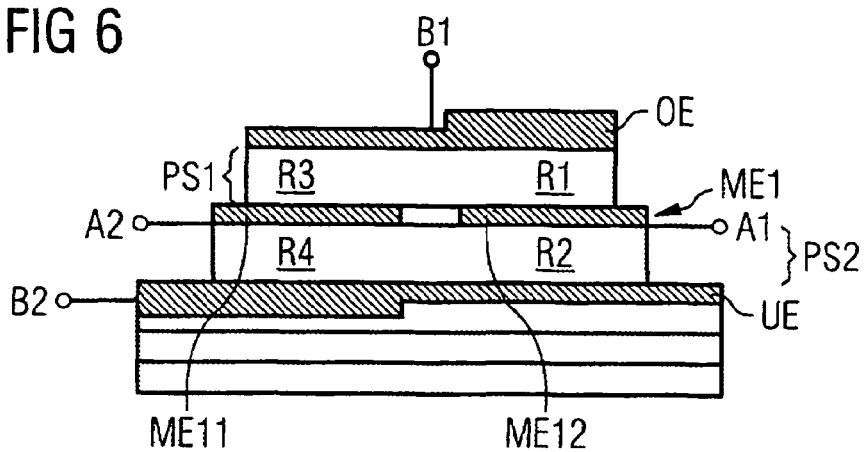
FIG. 6 is a schematic cross-sectional view of a BAW component with a resonator stack with a bridge connection of the sub-resonators.

An embodiment of the invention showing a bridge connection by a resonator stack is shown in FIG. 6. FIG. 6 shows a BAW component with a multi-layer structure containing at least two piezoelectric layers PS1 and PS2, an upper electrode layer OE, a lower electrode layer UE and a middle electrode layer ME1 arranged between the piezoelectric layers, with at least one of the electrode layers OE, ME1 and UE being structured in the lateral plane so that that electrode layer is formed into at least two sub-electrodes ME11 and ME12. Each of the sub-electrodes ME11 and ME12 forms, along with the electrode layers UE and OE arranged thereunder or thereover and the piezoelectric layer PS1 and PS2 lying therebetween sub-resonators R1, R2, R3 or R4. Sub-resonators R1, R2, R3 and R4 formed in this manner form with one another a bridge connection. The sub-resonators R1 and R4 or, respectively, R2 and R3, which are not electrically connected to one another, have preferably approximately equal or slightly different resonant frequencies. The region lying over the sub-electrode ME12 of the upper electrode layer OE is thickened up preferably through a material layer arranged thereover made of the same or another material. The region lying under the sub-electrode ME11 of the lower electrode layer UE is thickened up preferably through a material layer arranged thereunder made of the same or another material. With the change in the layer thickness of an electrode layer region, it becomes possible to reduce, for example, the resonant frequency of the corresponding sub-resonator R1 or R4 with respect to the resonant frequency of the other sub-resonator R3 or R4 arranged adjacent to it and containing the same piezoelectric layer PS1 or PS2. The layer thicknesses of the piezoelectric layers PS1 and PS2 are chosen to be preferably approximately equal.

It is possible in another variation of the invention that at least eight sub-resonators form more than one bridge connection, and the bridge connections are connected in series.

Figure 7A:
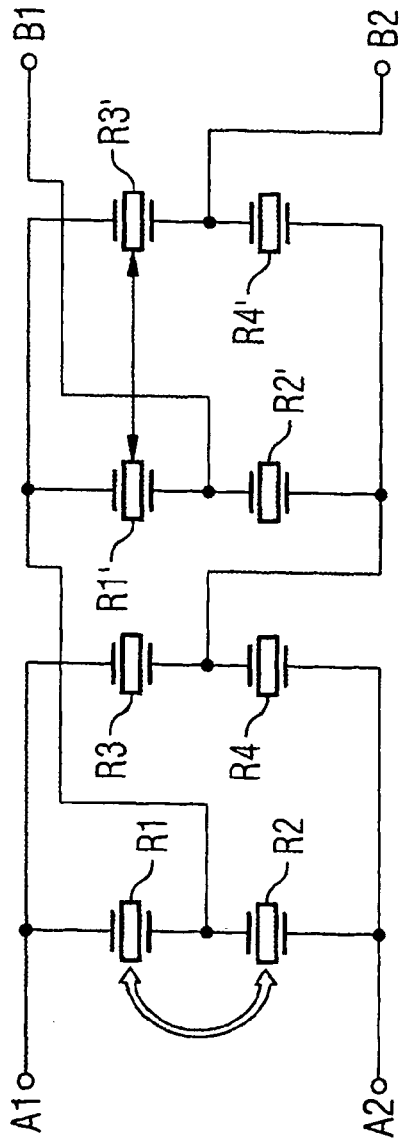
FIG. 7A is a circuit diagram of a BAW component with a plurality of series-connected bridge connections of the sub-resonators.
Figure 7B:
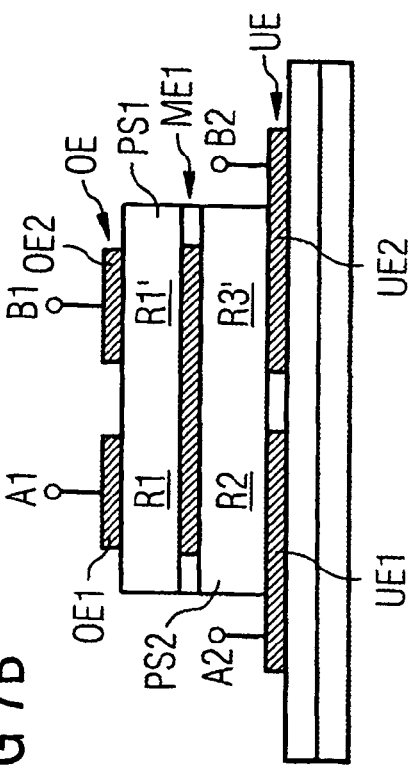
FIG. 7B is a schematic cross-sectional view of the BAW component with the resonator stack with a cascaded bridge connection of the sub-resonators according to FIG. 7A.

FIG. 7A shows a circuit diagram of a cascade circuit with two bridge connections. A first bridge connection is formed as in FIG. 4A. Reference numbers R1', R2', R3' and R4' stand for sub-resonators of a second bridge connection with is formed similarly or identically to the first bridge connection. FIG. 7B shows sectionally a component according to the invention corresponding to this cascade circuit. Here, unlike the exemplary embodiment shown in FIG. 6, the upper electrode layer OE and the lower electrode layer UE are structured, in each case, to form sub-electrodes OE1 and OE2 or UE1 and UE2. The sub-electrode OE1 forms together with the middle electrode layer ME1 and the piezoelectric layer PS1 lying therebetween the resonator R1, while a sub-resonator R1' is formed by the sub-electrode OE2, the middle electrode layer ME1 and a portion of the piezoelectric layer PS1 lying therebetween. The sub-electrode UE1 forms together with the middle electrode layer ME1 and the piezoelectric layer PS2 lying therebetween the sub-resonator R2, while a sub-resonator R3' is formed by the sub-electrode UE2 acting with the middle electrode ME1 and a portion of the piezoelectric layer PS2 lying therebetween. Here, sub-resonators R1 and R2, R1' and R3' arranged over one another are coupled with one another acoustically and electrically via the middle electrode layer ME1.

Through a cascade circuit with a plurality of bridge connections, a particularly high selectivity can be obtained. The series connections of the bridge connections in a resonator stack take place particularly simply by means of the upper electrode layer OE and the lower electrode layer UE.

Figure 8A:
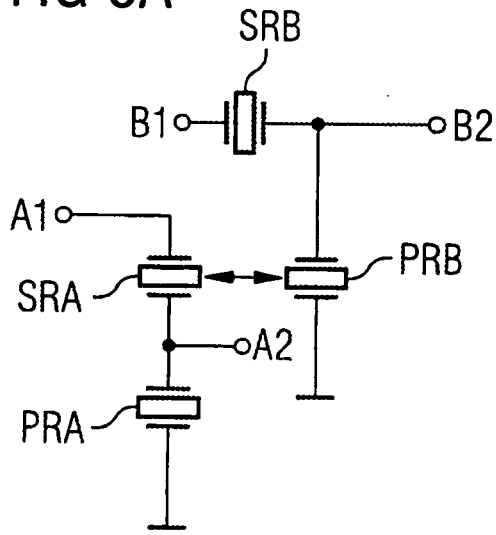
FIG. 8A is a circuit diagram of a BAW component with acoustically coupled resonators which are arranged in two different signal paths.
Figure 8B:
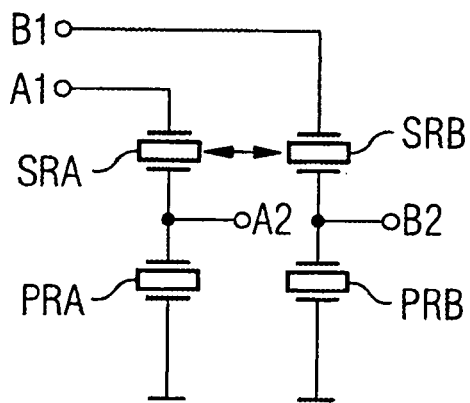
FIG. 8B is a circuit diagram of another BAW component with acoustically coupled resonators which are arranged in two different signal paths.
Figure 8C:
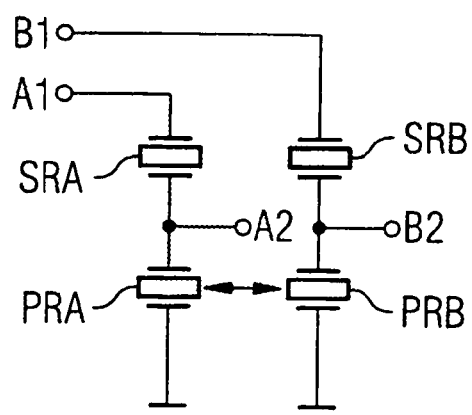
FIG. 8C is a circuit diagram of a third BAW component with acoustically coupled resonators which are arranged in two different signal paths.

FIGS. 8A, 8B and 8C show, in each case, circuit diagrams of an advantageous further development of the invention. In the component, first and second signal paths are present, the first signal path being arranged between electrical gates A1 and A2 and the second signal path between electrical gates B1 and B2. The first and second signal paths can implement, for example, a transmission path and a corresponding reception path of a filter, the transmission and reception paths being formed to transmit a signal and receive a signal of the same mobile radio system.

In general, in this variation of the invention, the first signal path or parallel to the first signal path, a first resonator, which may be SRA or PRA, is arranged. In the second signal path or parallel to the second signal path, a second resonator SRB or PRB is arranged. Here, the first and second resonators are acoustically coupled. The acoustic coupling between the corresponding resonators is indicated in FIGS. 8A, 8B and 8C and in subsequent Figures everywhere with arrows.

In the first signal path in FIG. 8A, a first resonator SRA, which is a series resonator, is arranged. Parallel to the second signal path, a second resonator PRB, which is a parallel resonator, is arranged. The first series resonator SRA and the second parallel resonator PRB are acoustically coupled.

It is also possible that the first resonator PRA is arranged parallel to the first signal path and the second resonator SRB in the second signal path and that they are acoustically coupled with one another.

In the exemplary embodiment shown in FIG. 8B, the first resonator SRA is arranged in the first signal path and the second resonator SRB is arranged in the second signal path and both are acoustically coupled resonators SRA and SRB being formed here as series resonators in different signal paths.

In the next exemplary embodiment shown in FIG. 8C, both the first resonator PRA is arranged parallel to the first signal path as well as the second resonator PRB parallel to the second signal path, both acoustically coupled resonators PRA and PRB being formed here as parallel resonators in different signal paths.

The first resonators SRA and PRA and the second resonators SRB and PRB can be arranged over one another in a resonator stack, and a coupling layer system is then arranged between the first and second resonators. In this case, the resonators are coupled acoustically in the vertical direction.

Another possibility consists of arranging the first resonators SRA and PRA and the second resonators SRB and PRB laterally adjacent to one another. In this case, the resonators are coupled acoustically through a lateral acoustic mode.

Figure 9A:
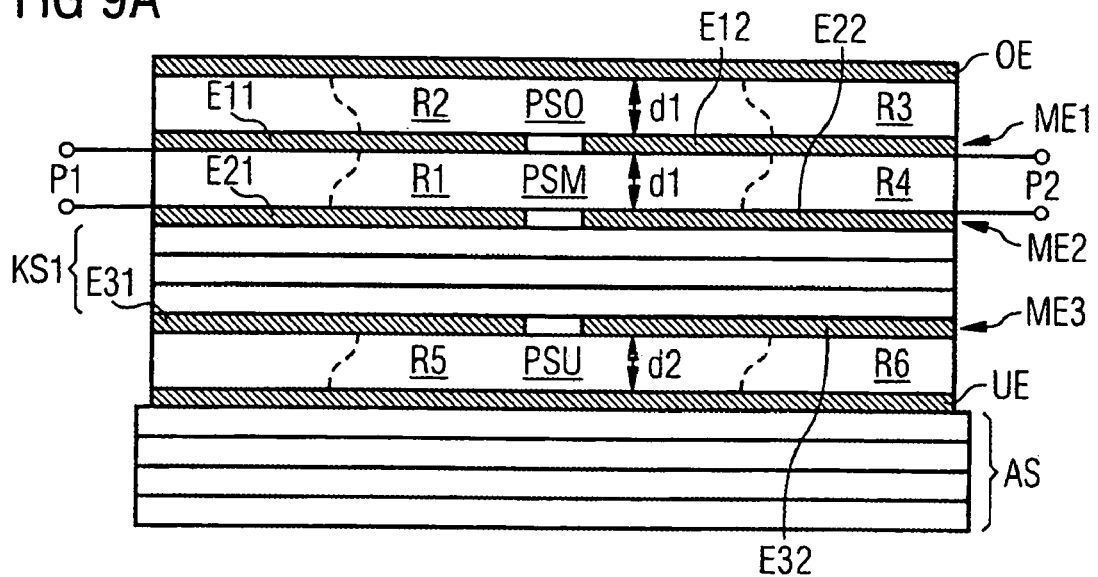
FIG. 9A is a schematic cross-sectional view of a BAW component with a resonator stack, with electrically isolated sub-resonators which are coupled acoustically through coupling resonators.
Figure 9B:
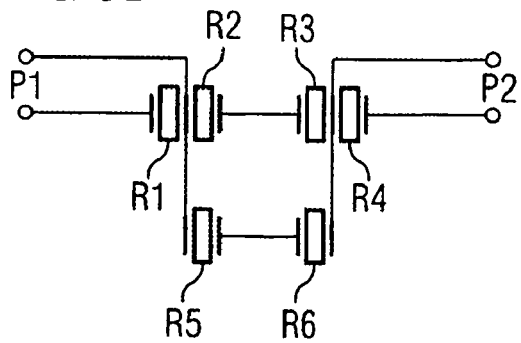
FIG. 9B is a circuit diagram of the BAW component according to FIG. 9A.
Figure 9C:
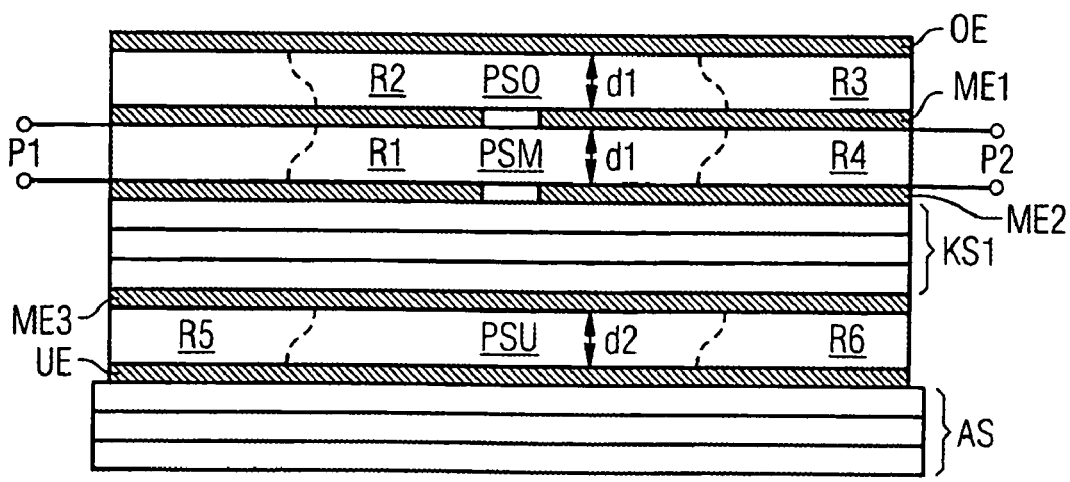
FIG. 9C is a schematic cross-sectional view of an advantageous exemplary embodiment of a BAW component with a resonator stack, with sub-resonators which are coupled acoustically through the coupling resonators.

FIGS. 9A and 9C show, in each case, a BAW component according to the invention in a further configuration.

In general, this is a component with a multi-layer structure which contains an upper piezoelectric layer PSO, a lower piezoelectric layer PSU and at least one middle piezoelectric layer PSM arranged therebetween with a continuous upper electrode layer OE arranged above the upper piezoelectric layer PSO, a continuous lower electrode UE arranged below the lower piezoelectric layer PSU. The middle electrode layer ME1 is arranged between the piezoelectric layer PSO and PSM, while a middle electrode layer ME2 is arranged between the piezoelectric layer PSM and a coupling layer system KS1 and a middle electrode layer ME3 is arranged between the coupling layer system KS1 and the lower piezoelectric layer PSU. At least two of the middle electrode layers ME1, ME2 and ME3 are structured in the lateral plane to form structure layers so that each structured layer has two electrically isolated sub-electrodes, such as E11, E12, E21, E22, E31, E32, as shown in FIG. 9A. The pairs of sub-electrodes, such as E11 and E21 or E12 and E22, or the pairs of electrodes and sub-electrodes, such as E31 and UE, E32 and UE, E11 and OE, or E12 and OE which are arranged over one another form, together with the piezoelectric layer lying therebetween in each case, a sub-resonator, such as R1, R2, R3, R4, R5 and R6. Sub-resonators R1 and R4 in FIG. 9A are arranged adjacent to one another and contain one of the middle piezoelectric layers PSM. The sub-resonators R2 and R3 containing the topmost electrode layer OE form, in each case, a coupling sub-resonator and the coupling sub-resonators formed in this manner are coupled, in each case, acoustically to the sub-resonator R1 and/or R4 lying thereunder, respectively.

The sub-resonator R1 is used preferably to couple in an electrical signal via the first electrical gate P1. The sub-resonator R4 arranged laterally adjacent to the sub-resonator R1 is used preferably to couple out a signal via the second electrical gate P2. The resonators R1 and R4 are electrically isolated from one another and are coupled acoustically via a series connection of the coupling sub-resonators R2 and R3 in a vertical direction, upward, as well as via a series connection of the coupling sub-resonators R5 and R6 in the other vertical direction, downward, so that there are two acoustic paths that are independent of one another. The BAW component of this sort is suitable particularly for implementing a balun functionality of the BAW filter.

FIG. 9A shows schematically that the upper piezoelectric layer PSO and the middle piezoelectric layer PSM arranged directly thereunder which is used to couple the signal in and out have approximately the same layer thickness d1. The layer thickness d1 corresponds essentially to a half wavelength. The layer thickness d2 of the lower piezoelectric layer PSU or additional middle piezoelectric layers can be chosen differently from the layer thickness d1.

It is also possible to arrange a coupling layer system between the upper piezoelectric layer PSO and the middle piezoelectric layer PSM lying thereunder in order to control the degree of coupling between the sub-resonators R1/R2 and R3/R4. Here, the thickness of the layer PSO is chosen to be less than the thickness of the layer PSM, the coupling layer system lying directly thereunder being preferably half of a wavelength. Different thicknesses of the piezoelectric layers are advantageous since, in this manner, additional pole points or rather maxima can be generated in the transfer function.

FIG. 9B shows a circuit diagram corresponding to the BAW component presented in FIG. 9A.

FIG. 9C shows a variation of the BAW component represented in FIG. 9A. The middle electrode layer ME3 arranged directly over the lower piezoelectric layer PSU is formed continuously here, which corresponds to a parallel connection of the sub-resonators R5 and R6.

Figure 10A:
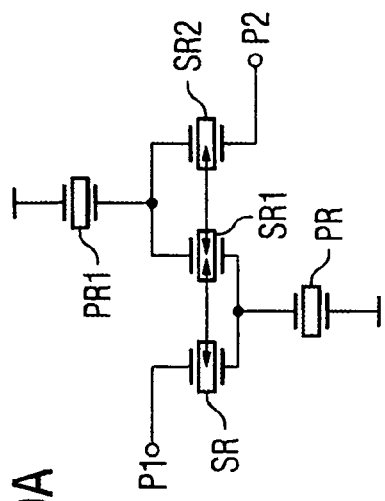
FIG. 10A is a circuit diagram of a BAW component with a ladder-type structure with acoustically coupled series resonators.

FIG. 10A shows the circuit diagram of a ladder-type structure with series resonators SR, SR1, SR2, which are arranged in a signal line between a first electrical gate P1 and a second electrical gate P2 and which are acoustically coupled with one another. FIG. 10A also shows parallel resonators PR and PR1, which are connected in parallel to the signal line.

Figure 10B:
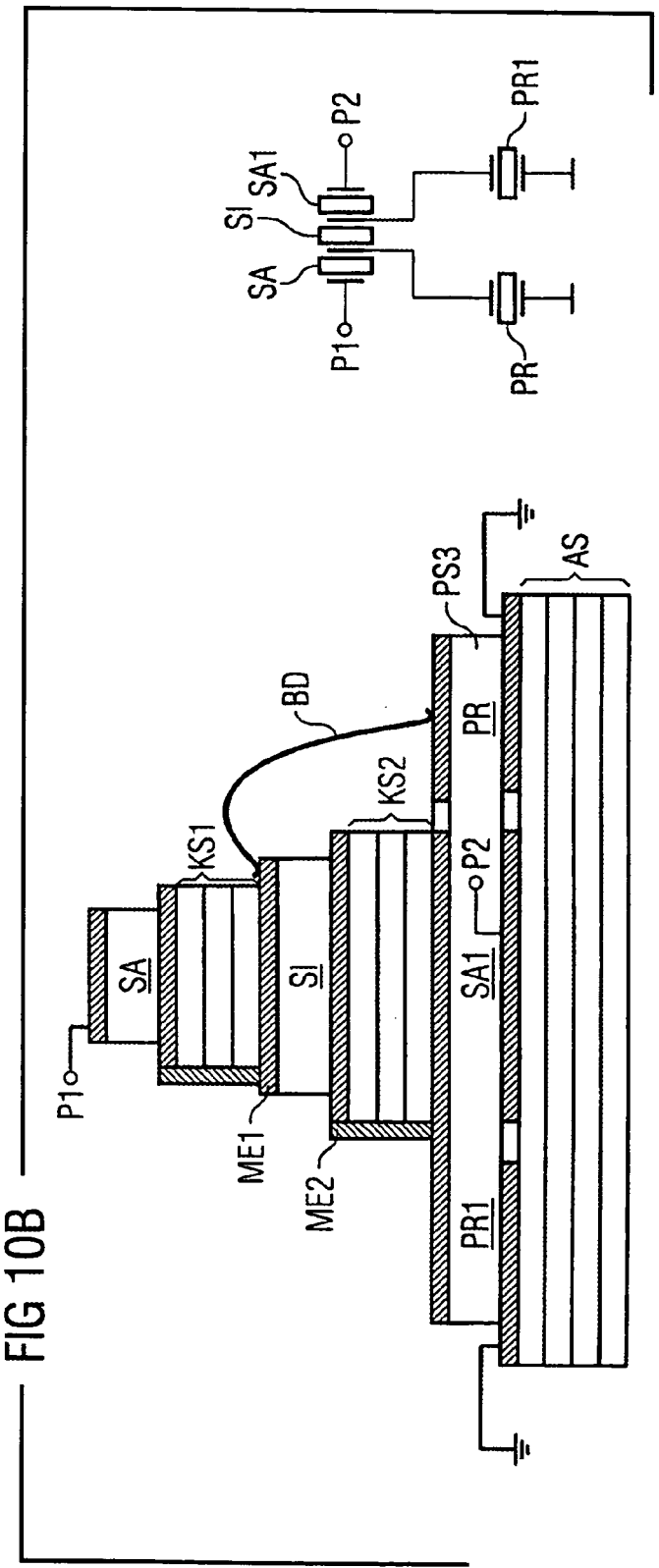
FIG. 10B is a schematic cross-sectional view of a BAW component with a ladder-type structure with acoustically-coupled series resonators arranged in the resonator stack on the left side of the Figure and a circuit diagram of the component on the right side of the Figure.

The circuit of FIG. 10A can be implemented with a design show in FIG. 10B with a resonator stack. The resonator stack has series resonators SA, SA1 arranged outside and at least one series resonator SI arranged therebetween with middle electrode layers ME1 and ME2. The series resonators SA, SI and SA1 connected in the signal path and arranged in the stack and also interconnected outside and inside are arranged over one another and acoustically coupled with one another. The sequence of the resonator in the interconnection corresponds to the relative arrangement in the stack. At least two of the middle electrode layers ME1 and ME2 are interconnected in each case with a parallel resonator PR or PR1 connected in parallel to the signal path. The series resonator SI, which is arranged inside or between the resonators SA and SA1 in the stack, is electrically connected to the parallel resonator PR by means of a bond wire BD.

The resonators PR1, SA1 and PR are arranged adjacent to one another and contain the same piezoelectric layer PS3.

The lateral cross-sectional area of the series resonators arranged over one another decreases from resonator to resonator upward, so that the electrode layer ME1 arranged directly on the inside resonator SI provides a connecting surface for a bond wire connection BD.

Through the acoustic coupling of the series resonator, in particular the ripple in the passband of the bandpass filter is improved. The edge steepness of the transfer function and the rejection band suppression are also improved.

Figure 10C:
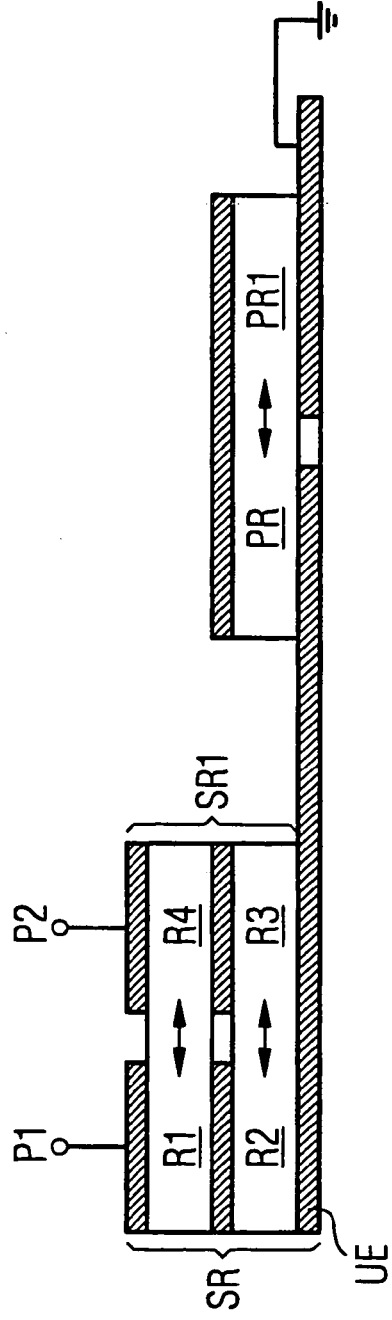
FIG. 10C is a schematic cross-sectional view of another exemplary embodiment of a BAW component with acoustically coupled, through lateral acoustic mode, series and parallel resonators.
Figure 10D:
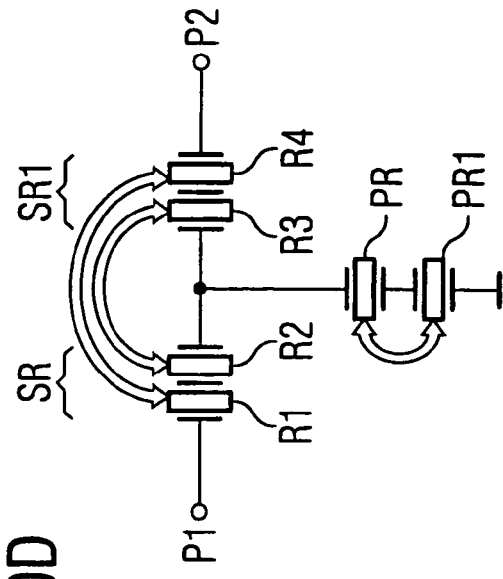
FIG. 10D is a circuit diagram of the BAW component according to FIG. 10C.

In FIG. 10C, a variant of a BAW component in the form of a T-element with series resonators SR, SR1 coupled acoustically in the lateral and vertical direction or rather parallel resonators PR, PR1 that are acoustically laterally coupled and arranged in series is shown in a schematic cross-section. In FIG. 10D, the corresponding circuit diagram is provided. The series resonators SR and SR1 are formed in a resonator stack through a suitable structuring of the electrode layers so that they have, in each case, sub-resonators R1 and R2 or R3 and R4 arranged over one another. The series resonators of each stack are electrically connected to one another and are connected to the parallel resonator PR preferably through a continuous electrode layer UE arranged therebelow. The parallel resonators PR and PR1 are formed as sub-resonators in a resonator layer region and arranged laterally adjacent to one another. In this exemplary embodiment, the parallel resonators PR and PR1 arranged adjacent to one another, as well as the sub-resonators R1 and R4 and R2 and R3, are coupled through a lateral acoustic mode. Moreover, the sub-resonators R1 and R2 and R3 and R4 arranged over one another are coupled acoustically to one another in a vertical direction. It is also possible for the parallel resonators PR and PR1 to be arranged over one another in a resonator stack and coupled acoustically in the vertical direction.

Figure 11:
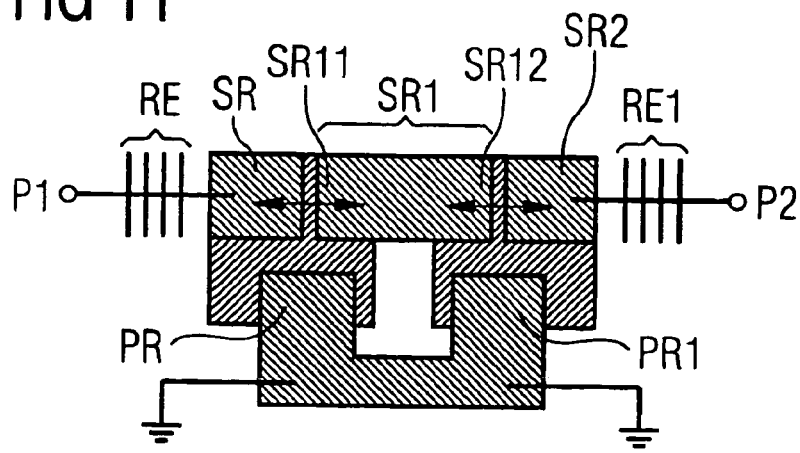
FIG. 11 is a schematic plan view of a BAW component with a ladder-type structure according to FIG. 10A with series resonators arranged laterally adjacent to one another and acoustically coupled with one another.
Figure 12A:
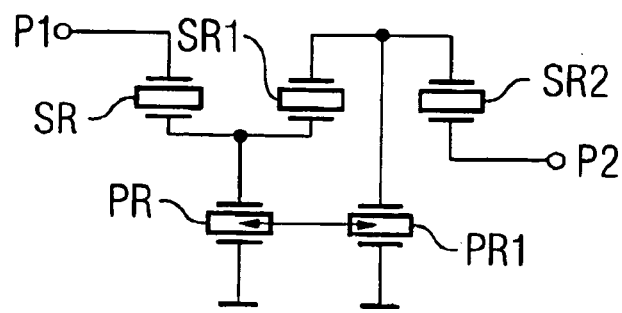
FIG. 12A is a circuit diagram of a BAW component with a ladder-type structure with acoustically coupled parallel resonators.
Figure 12B:
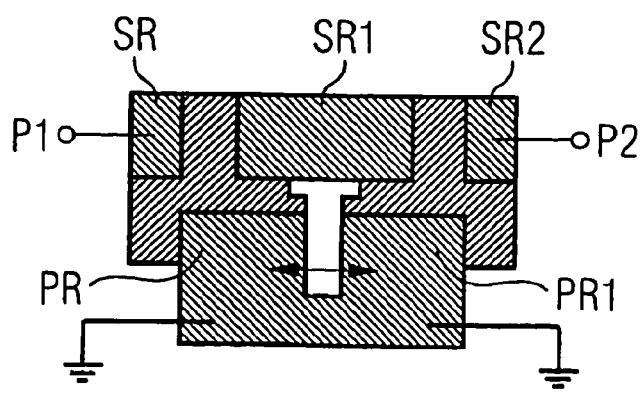
FIG. 12B is a schematic plan view of a BAW component with a ladder-type structure according to FIG. 12A with parallel resonators arranged laterally adjacent to one another and acoustically coupled with one another.

FIGS. 11 and 12B present additional embodiments of the invention. These embodiments represent a BAW component with the following features: a signal path arranged between a first electrical gate P1 and a second electrical gate P2, a plurality of series resonators SR, SR1 and SR2 and parallel resonators PR and PR1 arranged adjacent to one another, which have, in each case, two electrodes and a piezoelectric layer arranged therebetween, at least one of the series resonators being acoustically coupled with the series resonator arranged adjacent to it, such as illustrated by the circuit diagram in FIG. 10A, or at least one of the parallel resonators being acoustically coupled with the parallel resonator arranged adjacent to it through a lateral mode, such as illustrated by the circuit diagram in FIG. 12A.

In FIG. 11, the embodiment of the invention corresponds to the circuit diagram of FIG. 10A, with coupled series resonators SR, SR1 and SR2. These resonators are arranged, unlike in FIG. 10B, adjacent to one another in series and coupled acoustically in the lateral direction.

In order to prevent the emergence of the acoustic wave excited in series resonators SR and SR2 arranged on the outside of the lateral arrangement, one can use apparatuses in the outside edge region of these resonators to attenuate the waves. In FIG. 11, the series resonators arranged in series are surrounded by reflectors RE and RE1, which serve to reflect the surface wave excited on the surface and coupled with the lateral acoustic mode.

In addition, the series resonator SR1 is composed of two sub-resonators SR11 and SR12, which are connected in series and arranged adjacent to one another.

FIG. 12A shows the circuit diagram of a ladder-type structure with acoustically coupled parallel resonators PR and PR1 arranged in different parallel branches of the circuit.

FIG. 12B shows an embodiment of the invention corresponding to the circuit diagram of FIG. 12A with parallel resonators PR, PR1 arranged adjacent to one another and acoustically coupled with one another in the lateral direction. The acoustic coupling between the parallel resonators PR and PR1 is obtained particularly through a low lateral spacing between its electrodes. The lateral acoustic coupling between the series resonators SR, SR1 and SR2 is preferably suppressed in this exemplary embodiment.

In the design of BAW components, it can be advantageous possibly with regard to the improvement of the transmission characteristics of a component to acoustically couple a series resonator SR with a parallel resonator PR as shown by the circuit diagram in FIG. 13A, which tends to be seen as more of a disadvantage in the previously-known components and was avoided. FIG. 13B presents an exemplary implementation of a component of this type. FIG. 13B shows a BAW component with a resonator stack, with a signal path which is arranged between a first electrical gate P1 and a second electrical gate P2. The resonator stack has a series resonator SR and a parallel resonator PR which are arranged over one another and are acoustically coupled with one another and which form a coupling pair. The series resonator SR is arranged in the signal path and the parallel resonator PR is connected parallel to the signal path.

The arrangement according to the invention of an electrode layer UE11 connected to a reference potential or ground below in the resonator stack allows a simple configuration and mutual connection of individual elements of a ladder-type structure. The design takes place preferably so that the parallel resonators contain the lowest piezoelectric layer, the lowest electrode layer UE11 in the resonator stack being connected to the reference potential and is possibly a continuous electrode layer. The series resonators are arranged preferably adjacent to one another, and they contain a common piezoelectric layer.

In the preferred variation of the invention, series resonators SR and parallel resonators PR of the coupling pair are electrically connected to one another through a common middle electrode, such as the electrode layer ME. It can be provided that the series resonator SR and the parallel resonator PR are coupled by a coupling layer system which is arranged therebetween and is acoustically at least partially transmissive.

A component according to the invention can contain additional electrically interconnected coupling pairs which are arranged in the lateral direction adjacent to one another and are formed preferably in a resonator stack.

In FIG. 14A, a T-element with a parallel resonator PR, which is acoustically coupled to two series resonators SR and SR1, is presented in a circuit diagram. FIG. 14B shows an exemplary implementation of a circuit of this sort in a resonator stack. The series resonators SR and SR1 are formed as sub-resonators and are electrically and acoustically connected in the vertical direction via the middle electrode ME with the parallel resonator PR. The otherwise hard to access middle electrode layer ME serves here only as an electrical star connection of the two series resonators with a parallel resonator.

FIG. 15A shows a π element with two series resonators SR and SR1 connected in series which are each acoustically coupled with a parallel resonator PR and PR1, respectively. FIG. 15B shows, on the left side, an exemplary embodiment of a circuit of this sort in a resonator stack. The series resonators SR and SR1 and the parallel resonators PR and PR1 are formed as sub-resonators. The resonators SR and PR as well as the resonators SR1 and PR1 are arranged one over the other and are acoustically coupled in the vertical direction. The electrical gates P1 and P2 are connected, in each case, to sub-electrodes formed from the middle electrode layer ME. A circuit diagram of this variation of the invention is shown in the right side of FIG. 15B.

Figure 16B:
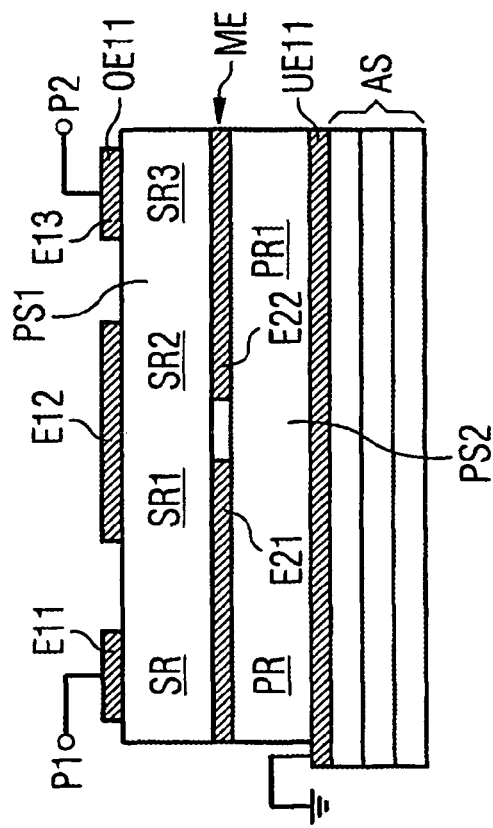
FIG. 16B is a schematic cross-sectional view of a BAW component with a resonator stack with acoustic coupling between series and parallel, resonators arranged over one another.
Figure 16A:
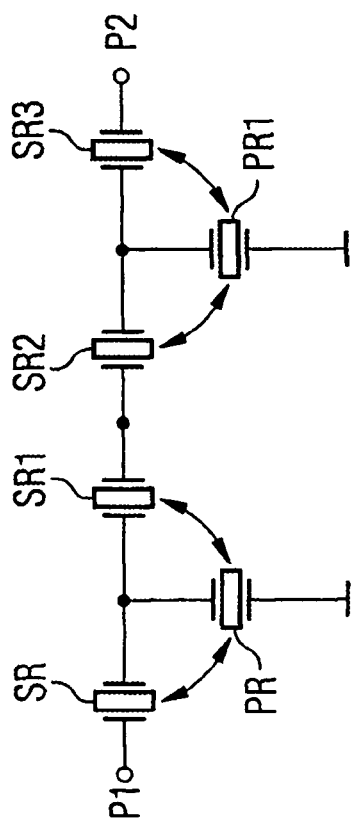
FIG. 16A is a circuit diagram of a BAW component with a ladder-type structure with acoustic coupling between series and parallel resonators.
Figure 16C:
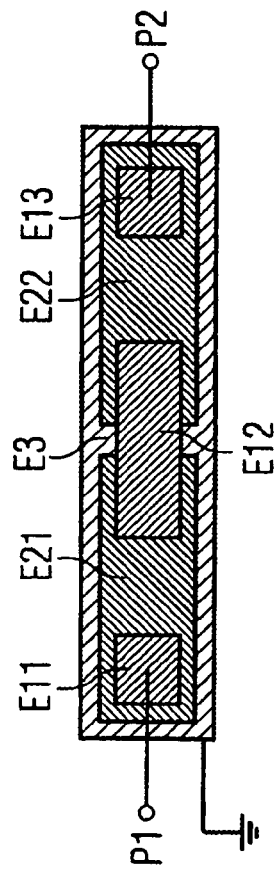
FIG. 16C is a top plan view of the BAW component according to FIG. 16B.

FIG. 16A presents T-elements connected in series with acoustically coupled series and parallel resonators. Here, the parallel resonator PR is acoustically coupled to series resonators SR and SR1. A parallel resonator PR1 is acoustically coupled to series resonators SR2 and SR3. In FIG. 16B, an exemplary implementation of the circuit of this type is shown in schematic cross-section as a resonator stack. The corresponding top view can be seen in FIG. 16C. The electrode layer OE11 arranged above is structured in the lateral plane so that sub-electrodes E11, E12 and E13 occur. The electrode layer ME arranged in the center is structured into sub-electrodes E21 and E22.

Figure 17A:
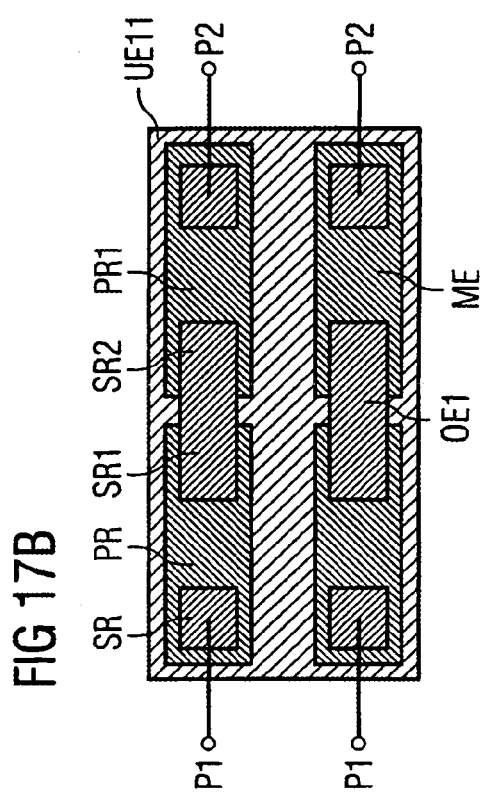
FIG. 17A is a circuit diagram of a BAW component suitable for feeding a balanced signal with a ladder-type structure with acoustic coupling between series and parallel resonators.
Figure 18A:
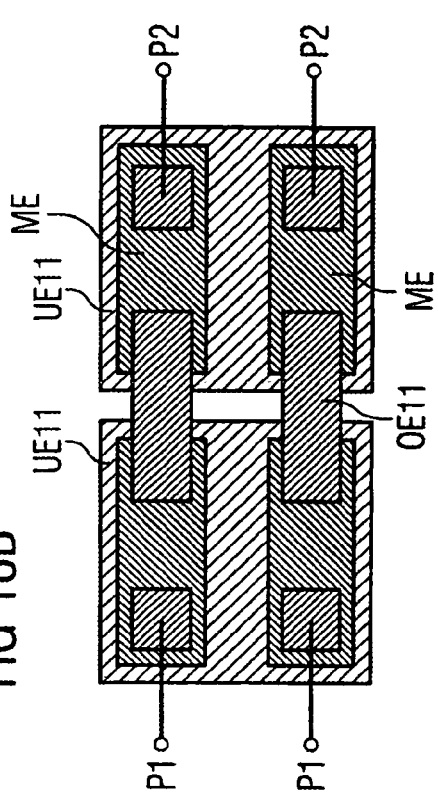
FIG. 18A is a circuit diagram of a BAW component suitable for feeding a balanced signal with a ladder-type structure with acoustic coupling between the series and parallel resonators.
Figure 17B:
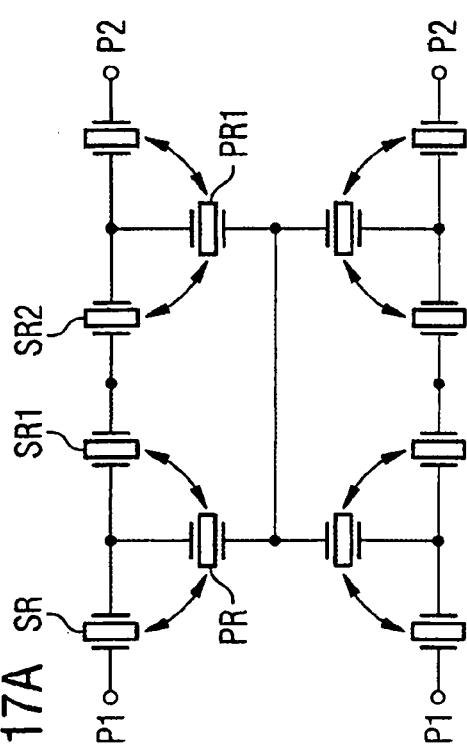
FIG. 17B is a schematic top plan view of the BAW component according to FIG. 17A.
Figure 18B:
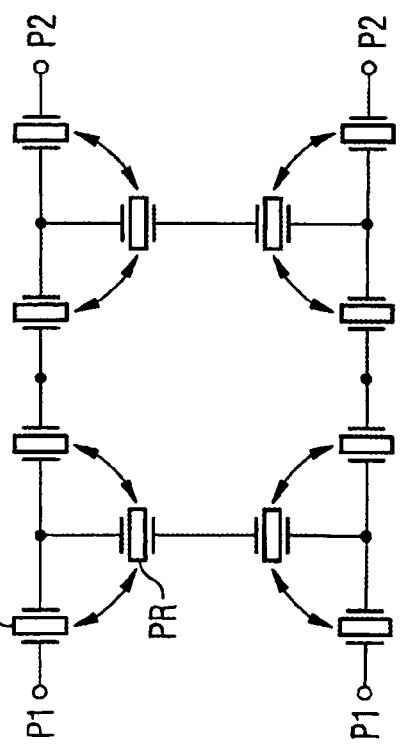
FIG. 18B is a schematic top plan view of the BAW component according to FIG. 18A.

FIGS. 17A and 18A present additional possible interconnections of T-elements, such as formed by the circuit diagram of FIG. 14A. These circuits are suitable for conducting a balanced electrical signal. In this case, the connection of the lower electrode layer UE11 to a common reference potential is not necessary. Instead, an electrical connection with one another of the parallel resonators connected in parallel to different signal lines takes place in this full-area layer. Here, instead of an electrode layer, the topmost layer of the acoustic mirror with a high acoustic impedance can be used insofar as it is formed from an electrically conductive material.

Besides the excitation of an acoustic wave in series resonators SR, SR1 and parallel resonators PR, PR1 in the variations of the invention illustrated in FIGS. 13B, 14B and 15B to 18B, an additional mode is excited in resonators or sub-resonators formed between the top electrode layer OE11 and the bottom electrode layer UE11. The undesired excitation of the fundamental mode of such resonators takes place at a frequency which corresponds to about half of the operating frequency. This effect can be suppressed through a suitable selection of bandwidth of the acoustic mirrors AS. The harmonic excitation of such resonators stakes place approximately at the frequency of the resonator SR, SR1, PR and PR1. Through a suitable selection of the relative electrode layer thicknesses, it is possible to set the resonant frequencies of individual resonators under discussion so that a pole point is produced in the passband intentionally at the upper or lower stop band edge of the filter, which leads to an increase in the rejection band suppression.

An offset between resonance frequencies of the series and parallel resonators can be obtained using different relative thicknesses of the piezoelectric layers or electrode layers.

In all embodiments or variations of the invention, it is provided that the layers of the multi-layer structure can consist, in each case, of multiple layers. Different variants of the invention or its essential elements can be combined with one another in an arbitrary manner, particularly in series or parallel to one another. In particular, acoustic coupling of the resonators in a circuit can exist simultaneously in the vertical or lateral direction.

The frequency offset with resonators or sub-resonators arranged adjacent to one another can be achieved everywhere by thickening the electrodes, preferably the upper sub-electrodes.

The shown filter structures with acoustically laterally and/or vertically coupled sub-resonators can be used in combination with concentrated elements including inductances, particularly series inductances in the parallel branches, capacitances, line sections, etc. Suppression of lateral modes in undesired directions can also be achieved through corresponding configuration of the electrodes, neutralizing, for example through structuring of the piezoelectric layer or thickening of the edge regions of the electrodes. The suppression of undesired longitudinal modes can take place, for example, using roughened regions of the acoustic mirror. All of the variants of the invention are applicable, moreover, to BAW resonators and components formed with membrane technology.

Since the presentation of the invention was not possible with more than a few exemplary embodiments, it is not limited to the presented exemplary embodiments. Within the context of the invention, additional possible variations are imaginable, which make use of the teachings according to the present invention and are covered by the claims.

We claim:

1. A component that functions with bulk acoustic waves, said component comprising:
    a multi-layer structure containing a resonator layer region which includes a first electrode layer arranged above and a second electrode layer arranged below and a piezoelectric layer arranged therebetween, all of said electrode layers being structured in a lateral plane to form at least two electrically isolated sub-electrodes for each electrode layer, said two sub-electrodes of respective layers being arranged over one another with said piezoelectric layer lying therebetween so as to form sub-resonators, at least two of said sub-resonators laterally arranged adjacent to one another in said resonator layer region being coupled acoustically through lateral acoustic mode;
    a carrier substrate on which said multi-layer structure is arranged; and
    an acoustic mirror arranged between said carrier substrate and said multi-layer structure.

2. A component according to claim 1, wherein said multi-layer structure includes a plurality of resonator layer regions, said plurality of resonator layer regions being arranged one over the other.

3. A component according to claim 2, further comprising: a coupling layer system arranged between said sub-electrodes of facing ones of said sub-resonators.

4. A component according to claim 2, wherein said sub-resonators arranged directly over one another have a common middle sub-electrode.

5. A component according to claim 1, wherein said sub-resonators which are acoustically coupled with one another are basic elements of a filter.

6. A component according to claim 5, further comprising: additional basic elements connected in series.

7. A component according to claim 1, wherein said sub-electrodes are formed differently from one another.

8. A component that functions with bulk acoustic waves with a signal path arranged between first and second electrode gates, said component comprising a plurality of resonators being formed by two electrodes and a piezoelectric layer arranged therebetween, said resonators being subdivided into series resonators and parallel resonators, with the series resonators being arranged in the signal path and the parallel resonators being arranged parallel to the signal path, at least two of the resonators being acoustically coupled to form coupled resonators, said coupled resonators being selected from a group consisting of series resonators and parallel resonators, wherein the parallel resonators are connected in series.

9. A component that functions with bulk acoustic waves with a resonator stack, said component comprising at least three piezoelectric layers and electrode layers arranged therebetween, said component having a signal path being arranged between first and second electrode gates in which series resonators are interconnected with one another, said resonator stack having series resonators arranged at outer portions of said resonator stack and at least one series resonator arranged at inner portions of said stack with middle electrodes, the series resonators arranged at outer portions and at inner portions being connected in the signal path arranged over one another and acoustically coupled with one another, at least two of the middle electrodes being interconnected in each case with a parallel resonator connected in parallel to the signal path, at least one such connection being made by a bond wire, the parallel resonators and a lowermost one of the series resonators arranged at said outer portions outside containing a same piezoelectric layer.

10. A component which functions with bulk acoustic waves and has a multi-layer structure, said component comprising: a resonator layer region which includes a piezoelectric layer having a first electrode layer arranged above the piezoelectric layer and a second electrode layer arranged below the piezoelectric layer, the electrode layers being structured in the lateral plane so that they provide at least four sub-electrodes in each electrode layer, two sub-electrodes arranged over one another forming together with the piezoelectric layer lying therebetween a sub-resonator, the sub-resonators formed in this manner forming with one another a bridge connection, at least two of the sub-resonators laterally arranged adjacent to one another being coupled acoustically through lateral acoustic mode.

11. A component according to claim 10, wherein said sub-resonators comprise at least eight sub-resonators, said at least eight sub-resonators forming a plurality of bridge connections and said bridge connections being connected in series.

12. A component that functions with bulk acoustic waves with a multi-layer structure, said multi-layer structure comprising at least two piezoelectric layers, an upper electrode layer, a middle electrode layer and a lower electrode layer, each of the electrode layers being structured in a lateral plane so that they provide at least two sub-electrodes, said sub-electrodes of the electrode layers forming together with the piezoelectric layer lying therebetween a sub-resonator with at least four sub-resonators resulting overall, the sub-resonators formed in this manner forming with one another a bridge connection.

13. A component that functions with bulk acoustic waves having a first signal path and a second signal path which are arranged, in each case, between two electrical gates, a first resonator being arranged selectively in the first signal path and/or parallel to the first signal path, a second resonator being arranged in the second signal path or parallel to the second signal path, the first and second resonators being acoustically coupled.

14. A component according to claim 13, wherein the first and second signal paths implement a transmission path and a corresponding reception path, the transmission and reception paths being formed to transmit a transmission signal and receive a reception signal of a same mobile radio system.

15. A component according to claim 13, wherein the first and second resonators are arranged in one of the following arrangements comprising the arrangement with the first resonator being arranged parallel to the first signal path and the second resonator being arranged in the second path and an arrangement with the first resonator being arranged in the first signal path and the second resonator being arranged parallel to the second signal path.

16. A component according to claim 13, wherein the first and second resonators are arranged in one of the following arrangements including an arrangement with the first resonator being parallel to the first signal path and the second resonator being parallel to the second path and an arrangement with the first resonator being arranged in the first signal path and the second resonator being arranged in the second signal path.

17. A component according to claim 13, wherein the first and second resonators are arranged in a resonator stack one over the other with a coupling layer being arranged therebetween.

18. A component according to claim 13, wherein the first and second resonators are arranged adjacent to one another and are coupled through a lateral acoustic mode.

19. A component that functions with bulk acoustic waves, said component comprising a multi-layer structure containing an upper piezoelectric layer, a lower piezoelectric layer and at least one middle piezoelectric layer arranged therebetween, a continuous upper electrode layer arranged above the upper piezoelectric layer, a continuous lower electrode layer arranged below the lower piezoelectric layer, a first middle electrode layer arranged above the lower piezoelectric layer, additional middle electrode layers being arranged between the piezoelectric layers, at least two of the middle electrode layers being structured in the lateral plane to form structured electrode layers which have at least two isolated sub-electrodes, a coupling layer system being arranged between the first middle electrode layer and the next middle electrode layer disposed thereabove, the sub-electrodes coacting with each other and with the other middle layers and the piezoelectric layers lying therebetween to form sub-resonators, said sub-resonators being arranged adjacent to one another and containing one of the middle piezoelectric layers being provided to couple in and couple out an electrical signal, the sub-resonators containing the topmost electrode layer forming, in each case, a coupling sub-resonator, the coupling sub-resonator being connected, in each case, acoustically to the sub-resonators lying thereunder.

20. A component according to claim 19, wherein the first middle electrode layer arranged over the lower piezoelectric layer is a continuous middle electrode layer.

21. A component according to claim 19, wherein the first middle electrode layer arranged directly over the lower piezoelectric layer is structured in the lateral plane to form at least two electrically isolated sub-electrodes.

22. A component that functions with bulk acoustic waves with a resonator stack, said component having a signal path which is arranged between a first electrical gate and a second electrical gate in which a series resonator is arranged, the resonator stack having the series resonator and a parallel resonator which are arranged over one another and are acoustically coupled with one another and which form a coupling pair, the parallel resonator being connected in parallel to the signal path, a further electrically interconnected coupling pair being provided which are arranged in a lateral direction adjacent to one another.

23. A component according to claim 22, further comprising: an electrode layer arranged below in the resonator stack and connected to a reference potential.

24. A component according to claim 22, in which the series resonator and the parallel resonator are coupled by a coupling layer system which is arranged therebetween and is acoustically at least partially transmissive.

25. A component according to claim 22, in which the series resonator and the parallel resonator of the coupling pair are electrically connected to one another.

* * * * *